United States Patent
Gerlach et al.

(10) Patent No.: US 6,977,386 B2
(45) Date of Patent: Dec. 20, 2005

(54) ANGULAR APERTURE SHAPED BEAM SYSTEM AND METHOD

(75) Inventors: Robert L. Gerlach, Portland, OR (US); Mark W. Utlaut, Scappoose, OR (US)

(73) Assignee: FEI Company, Hillsboro, OR (US)

( * ) Notice: Subject to any disclaimer, the term of this patent is extended or adjusted under 35 U.S.C. 154(b) by 45 days.

(21) Appl. No.: 10/688,810

(22) Filed: Oct. 17, 2003

(65) Prior Publication Data

US 2004/0140438 A1    Jul. 22, 2004

Related U.S. Application Data

(63) Continuation-in-part of application No. 09/765,806, filed on Jan. 19, 2001.

(51) Int. Cl.[7] ............................................... G21G 5/00
(52) U.S. Cl. ............................. 250/492.21; 250/492.3
(58) Field of Search ........................ 250/492.21, 492.3

(56) References Cited

U.S. PATENT DOCUMENTS

| | | | | |
|---|---|---|---|---|
| 4,804,851 A | * | 2/1989 | Nixon | ................... 250/492.2 |
| 5,065,034 A | * | 11/1991 | Kawanami et al. | ...... 250/505.1 |
| 5,825,035 A | * | 10/1998 | Mizumura et al. | ...... 250/423 R |
| 6,635,891 B1 | * | 10/2003 | Nakano et al. | ........ 250/492.22 |

* cited by examiner

Primary Examiner—John R. Lee
Assistant Examiner—David A. Vanore
(74) Attorney, Agent, or Firm—Michael O. Scheinberg

(57) ABSTRACT

The present invention provides improved angular aperture schemes for generating shaped beam spots having a desired geometric shape from rectangular, elliptical, and semi-elliptical apertures having one sharp edge. A sharper beam edge can be generated by offsetting the rectangular or elliptical aperture in combination with under or over focus. In the spherical aberration limit, under-focused semi-circle apertures provide a sharp, flat edge. The sharp edge can be made resolute enough for precision milling applications, and at the same time, the spot can be made large enough with enough overall current and current density to efficiently mill away material in either a production or laboratory environment. Depending on the particular beam spot that is desired, combinations of techniques including defocusing, aperture offsetting, and stigmation adjustment, can be used in both spherical aberration dominant and chromatic aberration dominant environments to achieve a desired beam for a desired application.

9 Claims, 15 Drawing Sheets

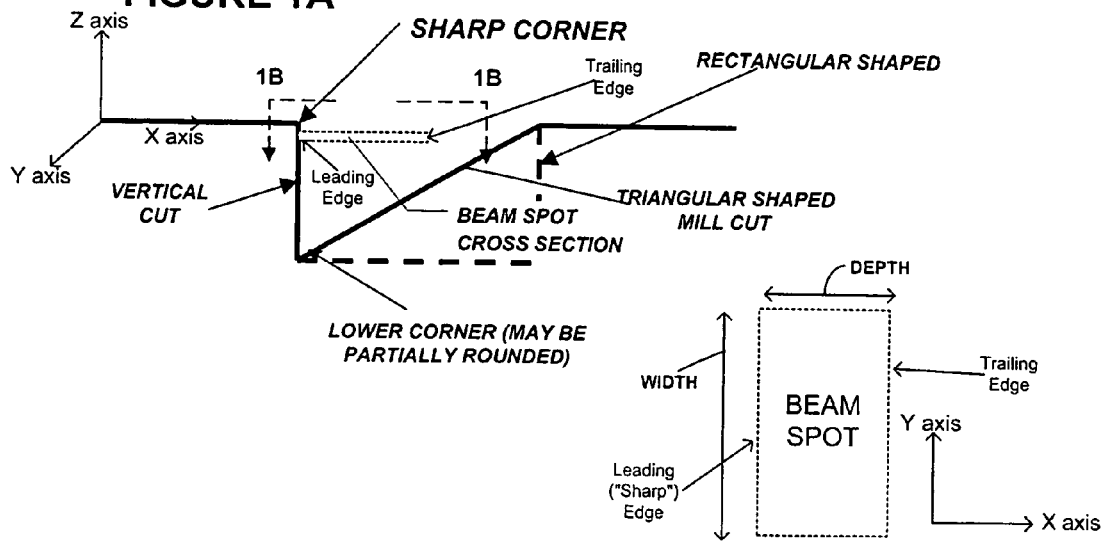
FIGURE 1A
FIGURE 1B
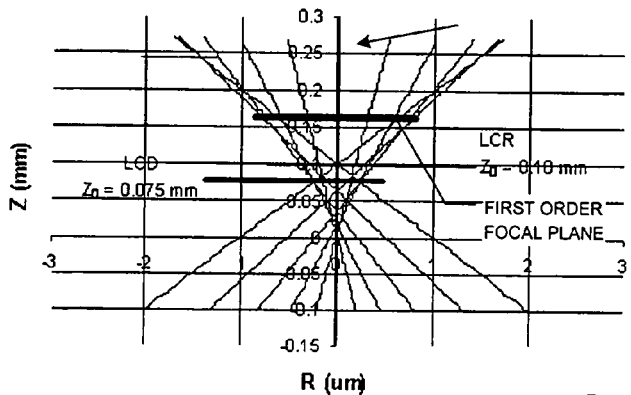
FIGURE 2A
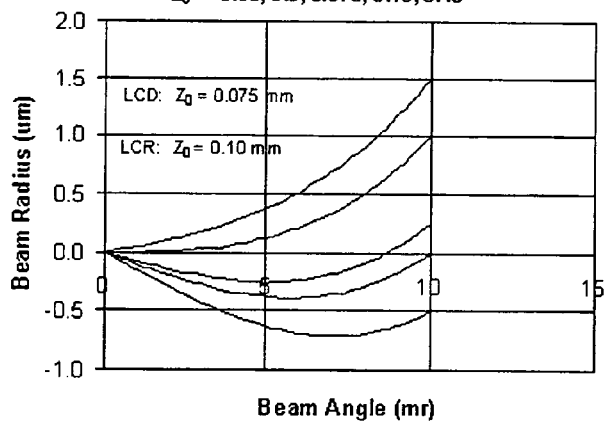
FIGURE 2B

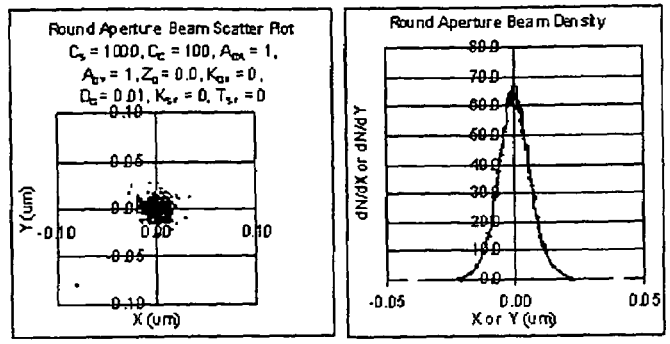
FIGURE 7A   FIGURE 7B
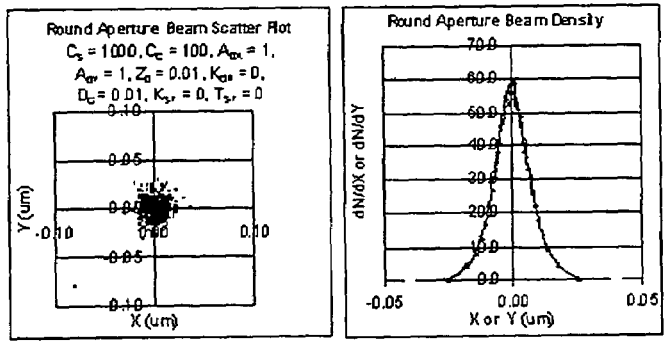
FIGURE 8A   FIGURE 8B
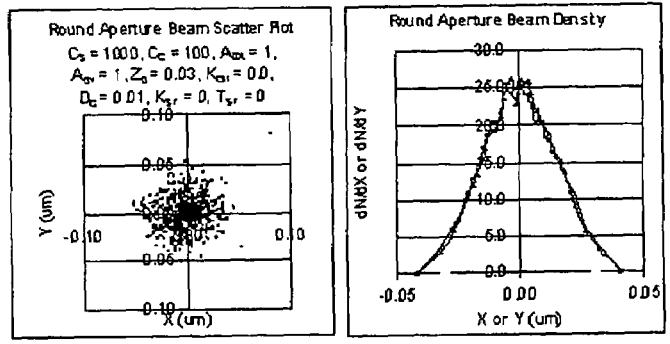
FIGURE 9A   FIGURE 9B
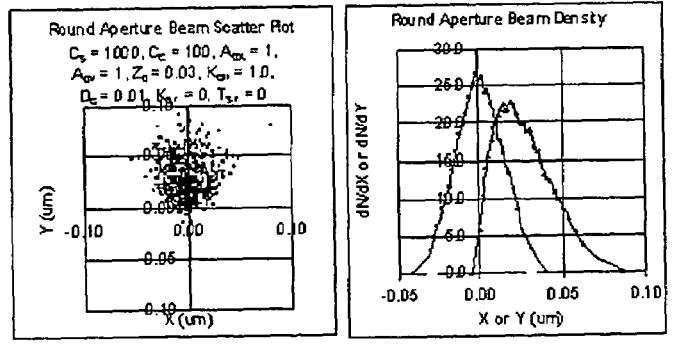
FIGURE 10A   FIGURE 10B

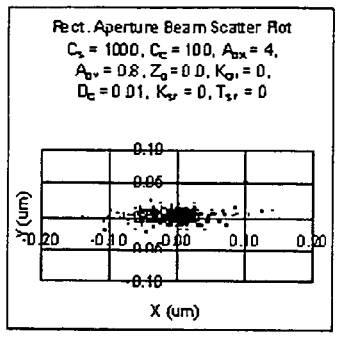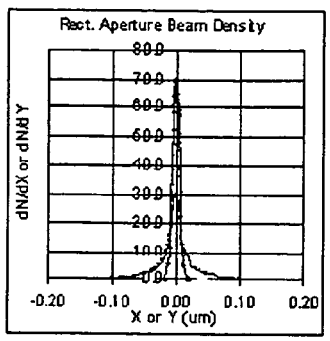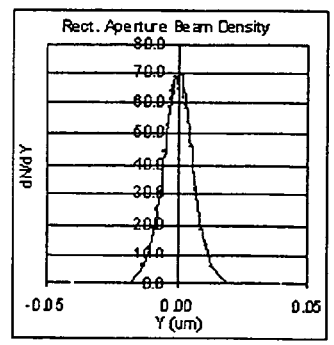
FIGURE 11A   FIGURE 11B   FIGURE 11C
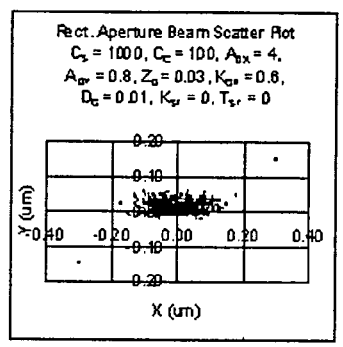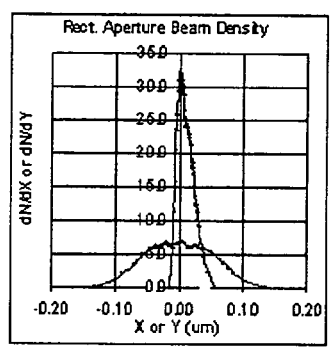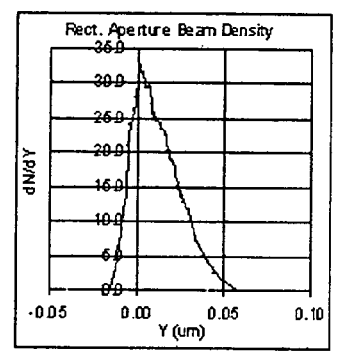
FIGURE 12A   FIGURE 12B   FIGURE 12C
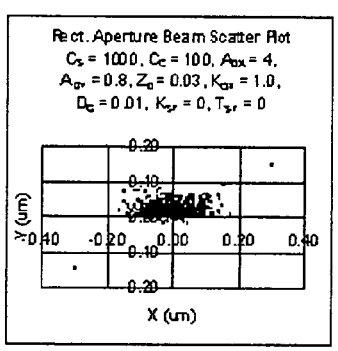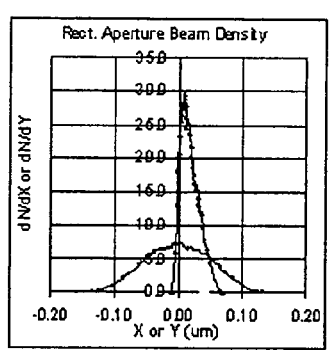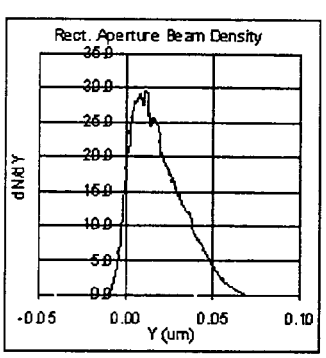
FIGURE 13A   FIGURE 13B   FIGURE 13C
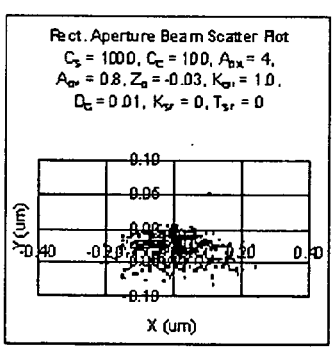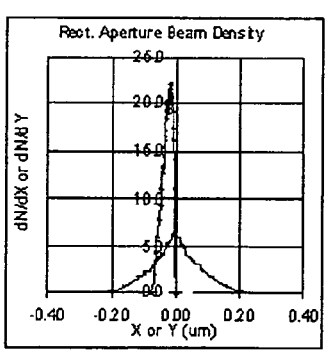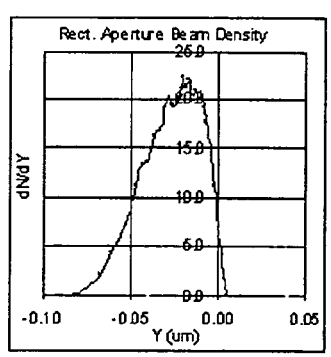
FIGURE 14A   FIGURE 14B   FIGURE 14C

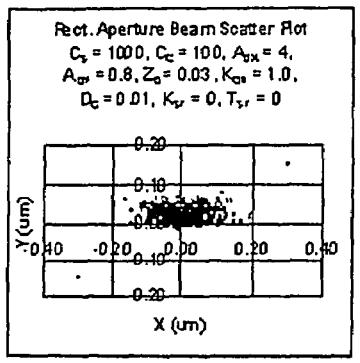 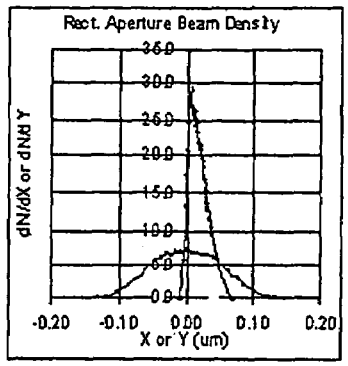 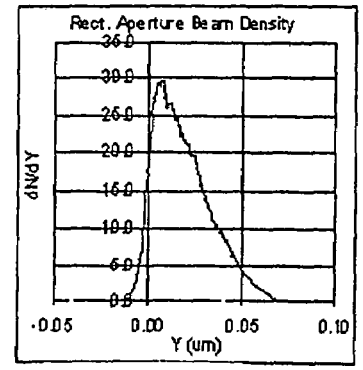
FIGURE 15A  FIGURE 15B  FIGURE 15C
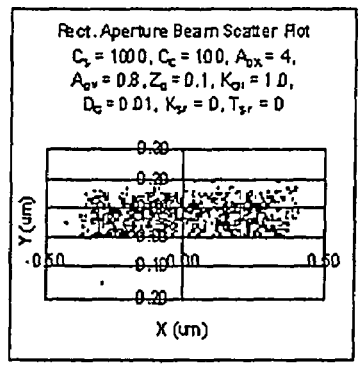 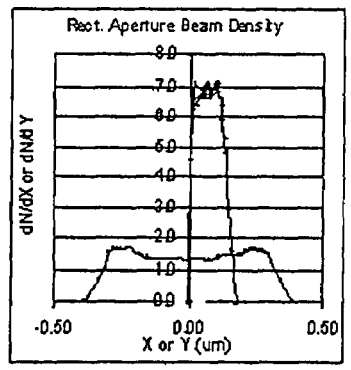 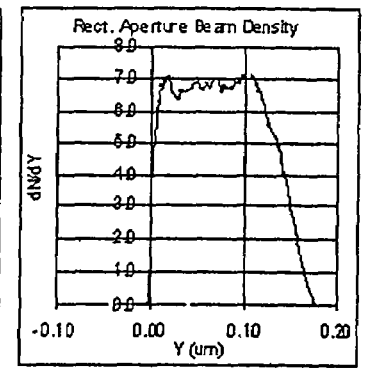
FIGURE 16A  FIGURE 16B  FIGURE 16C
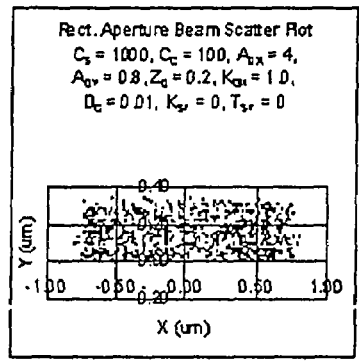 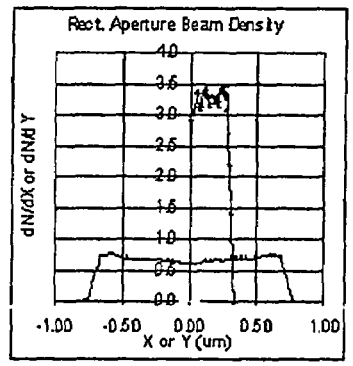 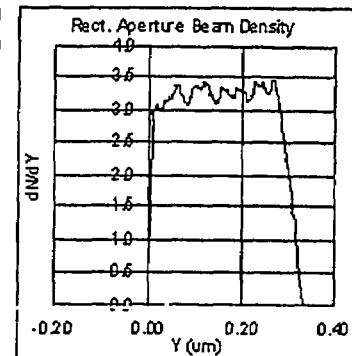
FIGURE 17A  FIGURE 17B  FIGURE 17C

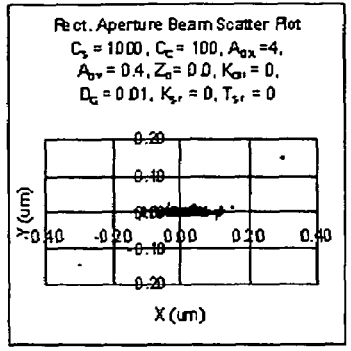 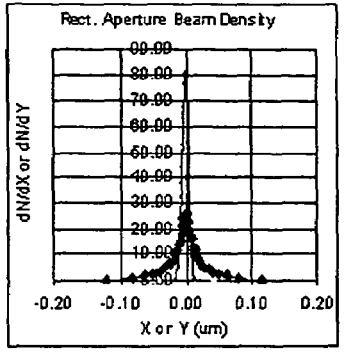 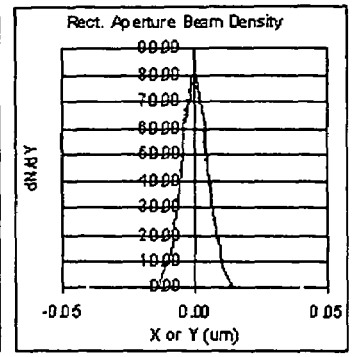
FIGURE 18A  FIGURE 18B  FIGURE 18C
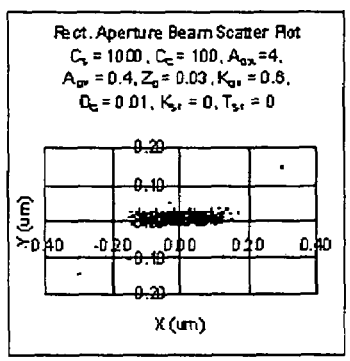 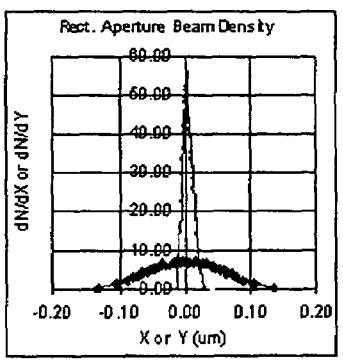 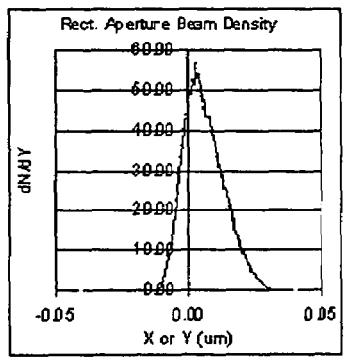
FIGURE 19A  FIGURE 19B  FIGURE 19C
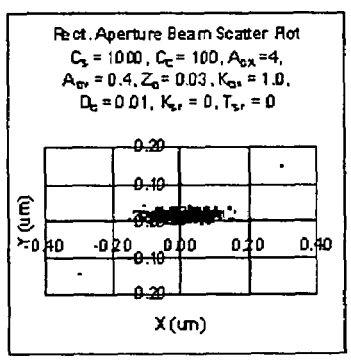 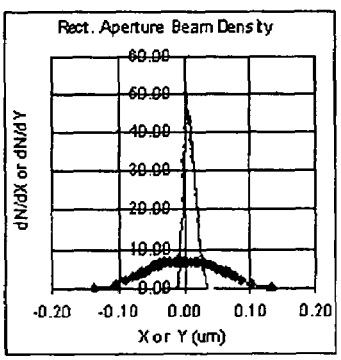 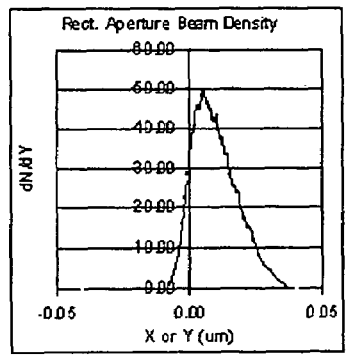
FIGURE 20A  FIGURE 20B  FIGURE 20C

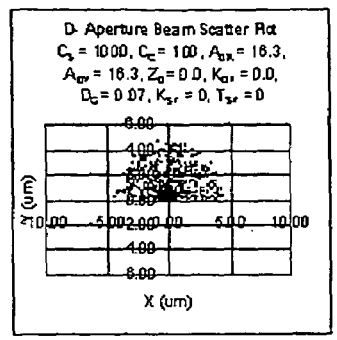 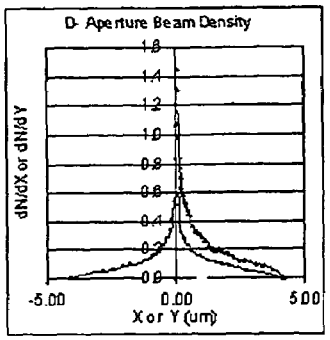
FIGURE 21A     FIGURE 21B
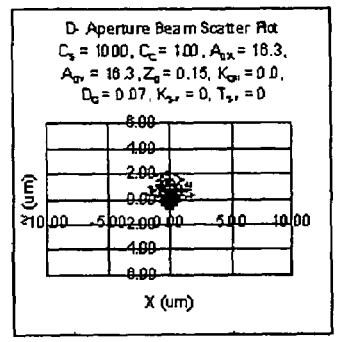 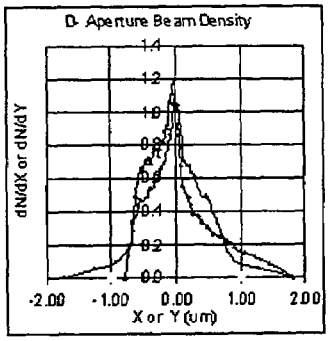
FIGURE 22A     FIGURE 22B
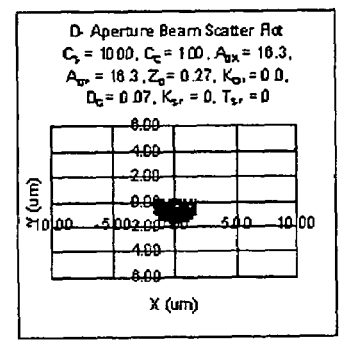 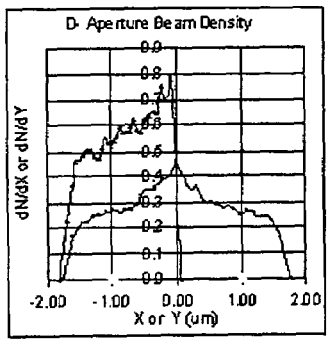
FIGURE 23A     FIGURE 23B
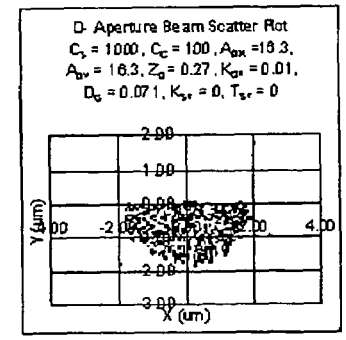 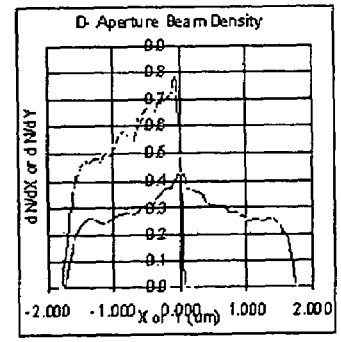
FIGURE 24A     FIGURE 24B

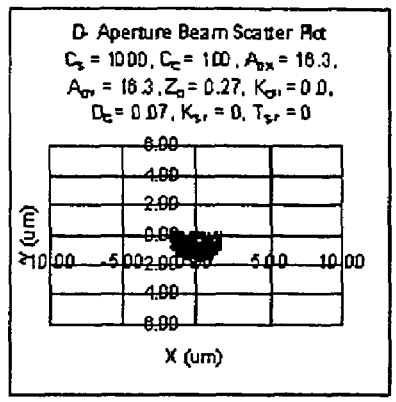 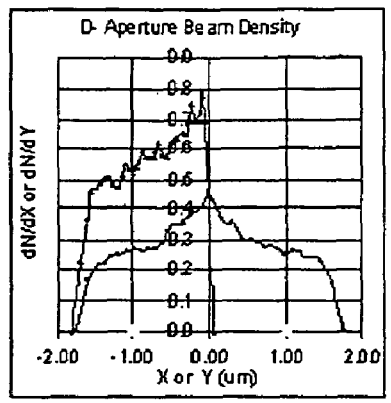
FIGURE 25A     FIGURE 25B
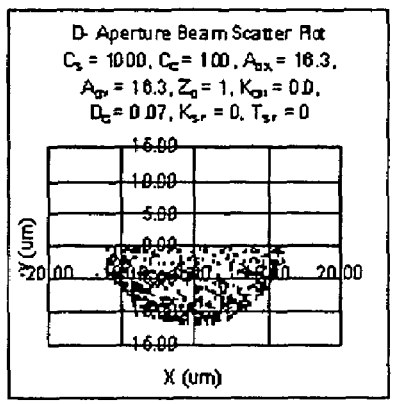 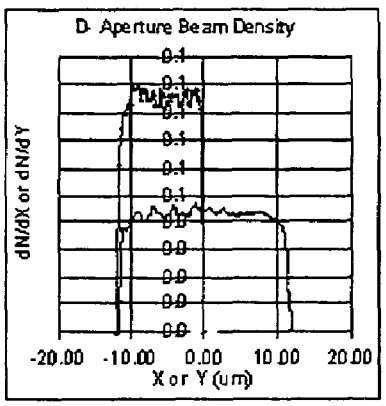
FIGURE 26A     FIGURE 26B
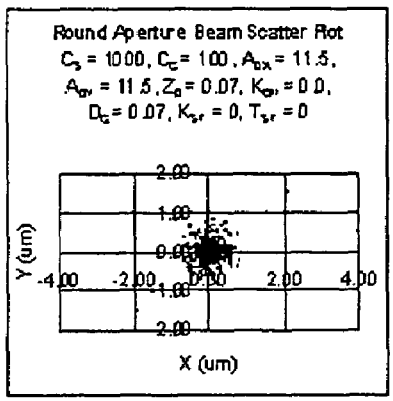 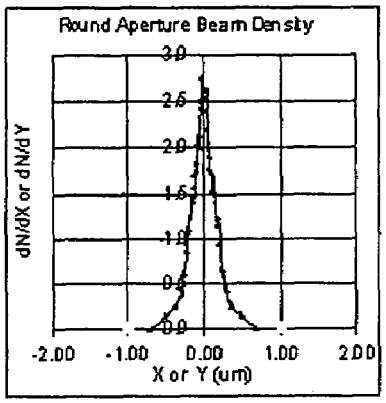
FIGURE 27A     FIGURE 27B

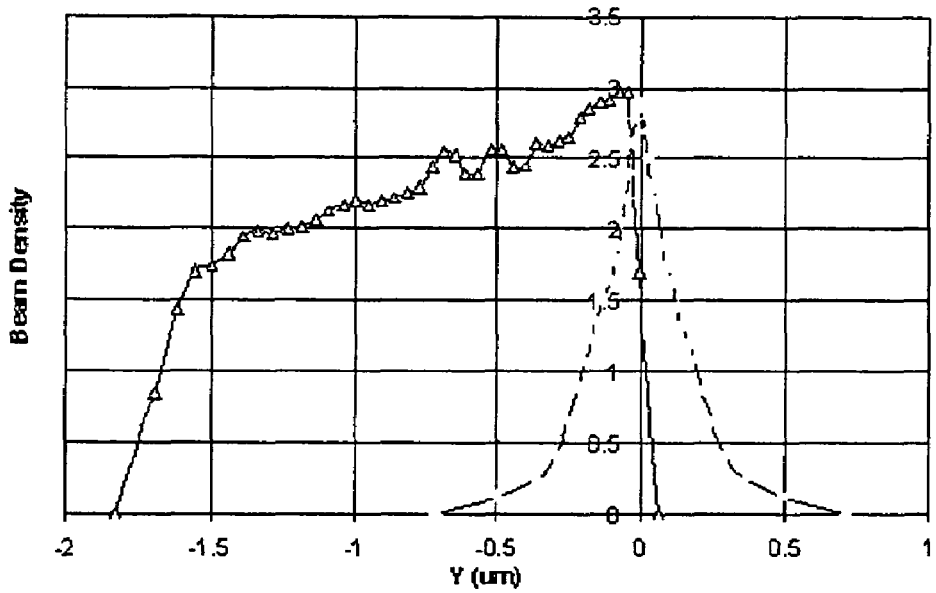
FIGURE 28
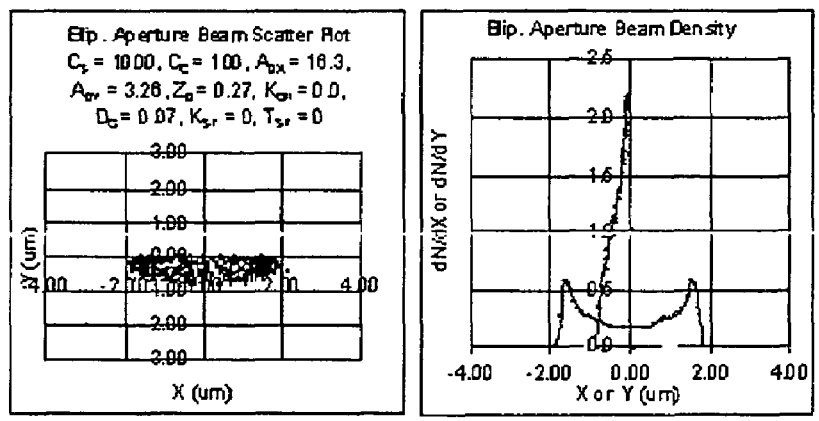
FIGURE 29A  FIGURE 29B

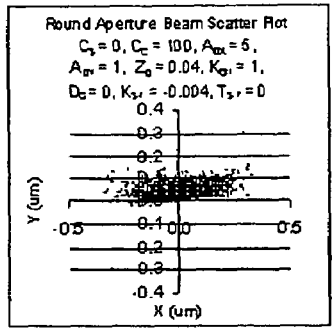 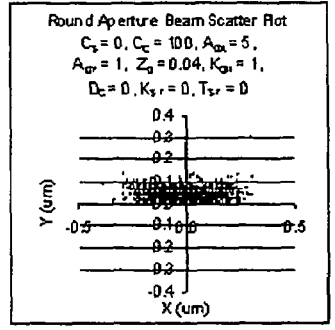 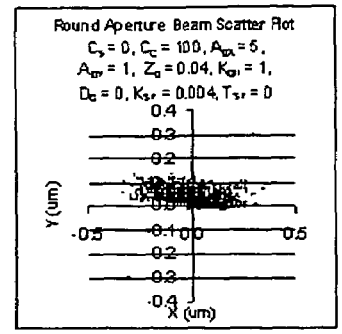
FIGURE 30A   FIGURE 30B   FIGURE 30C
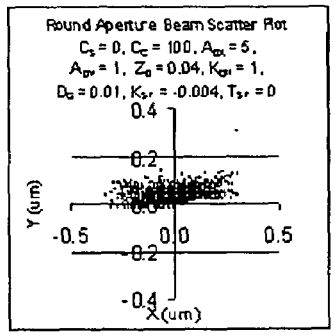 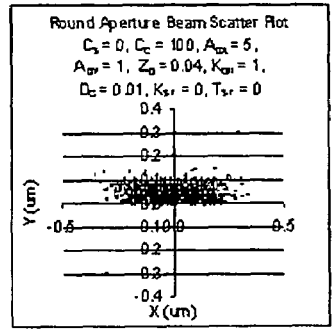 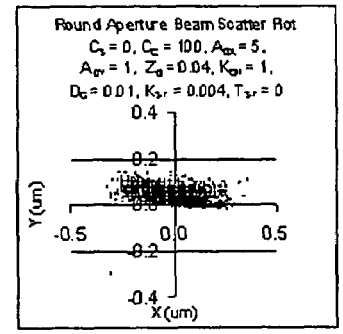
FIGURE 31A   FIGURE 31B   FIGURE 31C
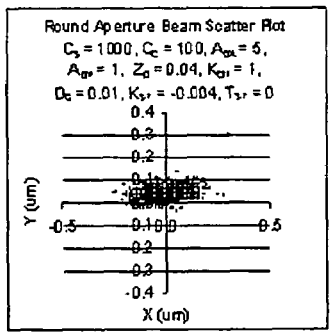 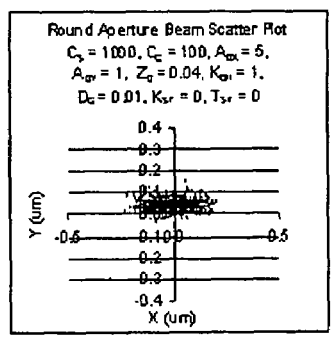 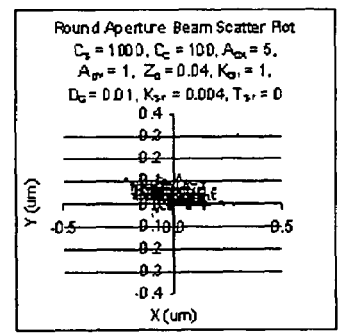
FIGURE 32A   FIGURE 32B   FIGURE 32C

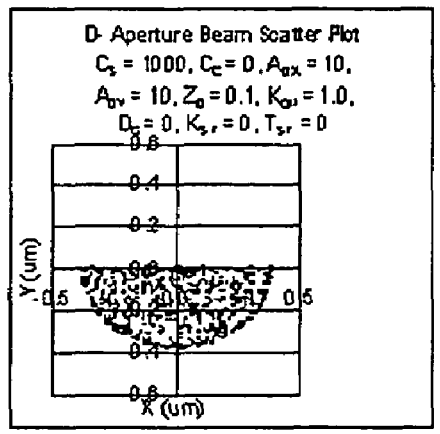 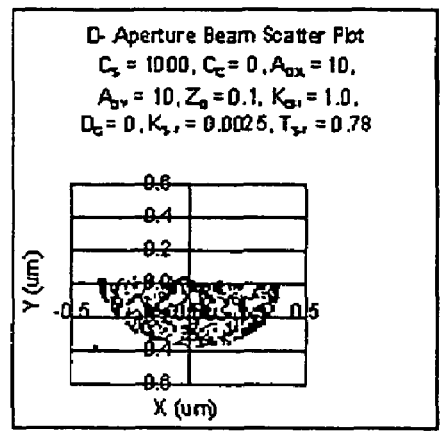
FIGURE 33A  FIGURE 33B
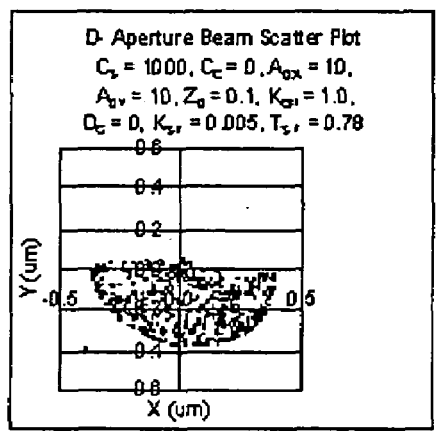 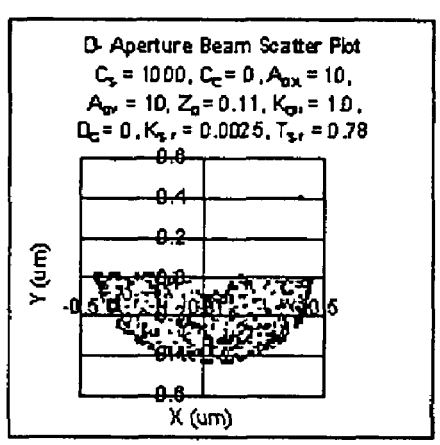
FIGURE 33C  FIGURE 33D

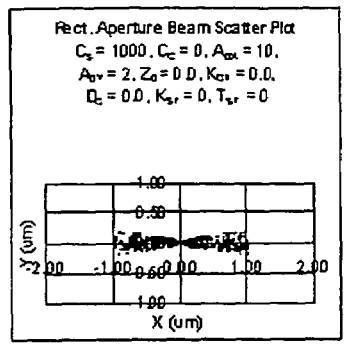
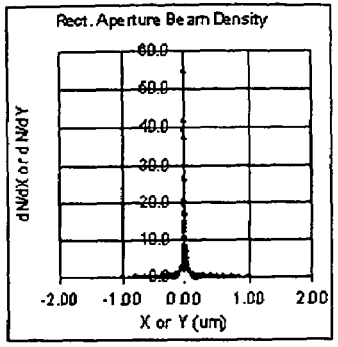
FIGURE 34A  FIGURE 34B
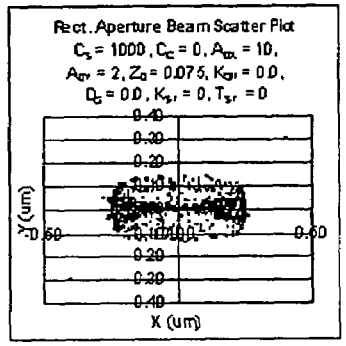
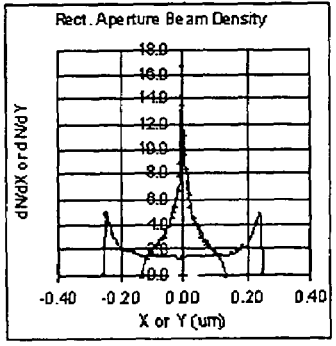
FIGURE 35A  FIGURE 35B
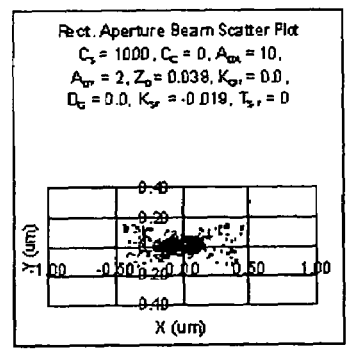
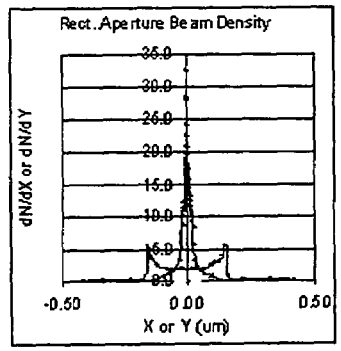
FIGURE 36A  FIGURE 36B
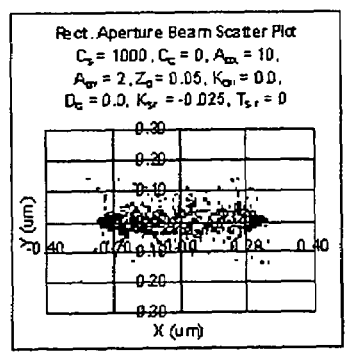
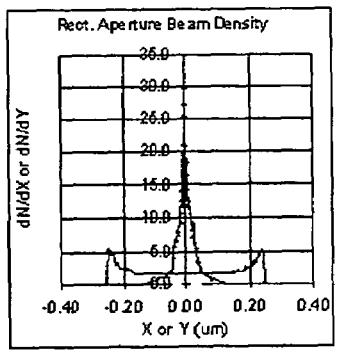
FIGURE 37A  FIGURE 37B

| Optical Parameters | | | | | | | | | Beam Width | | 15-85% Rise | | Y-Tail Initial Rise ($\mu m$) |
|---|---|---|---|---|---|---|---|---|---|---|---|---|---|
| $C_S$ (mm) | $C_C$ (mm) | $A_{0X}$ (rad) | $A_{0Y}$ (rad) | $Z_0$ (mm) | $K_{off}$ | $D_G$ ($\mu m$) | $K_{ST}$ (mm) | $I_B$ (nA) | $X_{fw}$ ($\mu m$) | $Y_{fw}$ ($\mu m$) | dX ($\mu m$) | dY ($\mu m$) | |
| Small Beams | | | | | | | | | | | | | |
| Round 1000 | 100 | 1 | 1 | | | .01 | | .0076 | .052 | .052 | .010 | .010 | M |
| Round 1000 | 100 | 1 | 1 | .03 | 1.0 | .01 | | .0076 | .083 | .094 | .022 | .013 | S |
| Rect. 1000 | 100 | 4 | .8 | | | .01 | | .031 | .24 | .044 | .026 | .009 | M |
| Rect. 1000 | 100 | 4 | .8 | .03 | 1.0 | .01 | | .031 | .27 | .080 | .060 | .006 | S |
| 50 nA Beams | | | | | | | | | | | | | |
| Round 1000 | 100 | 11.5 | 11.5 | .07 | | .071 | | 50 | 1.4 | 1.4 | .26 | .26 | L |
| Round 1000 | 100 | 11.5 | 11.5 | .07 | .5 | .071 | | 50 | 2.9 | 4.0 | .50 | .24 | VL |
| D 1000 | 100 | 16.3 | 16.3 | .27 | | .071 | | 50 | 3.5 | 1.8 | .20 | .068 | S |
| Rect. 1000 | 100 | 22.7 | 4.54 | .30 | | .071 | -.10 | 50 | 6.4 | 2.3 | .2 | .60 | M |

FIGURE 38

ANGULAR APERTURE SHAPED BEAM SYSTEM AND METHOD

This application is a continuation-in-part of U.S. patent application Ser. No. 09/765,806, filed Jan. 19, 2001.

TECHNICAL FIELD OF THE INVENTION

The present invention relates generally to shaped beams. In particular, it relates to shaped beams having a sharp edge or elongated beams having the same width as a round beam but having more beam current.

BACKGROUND OF THE INVENTION

Fundamental physics is beginning to limit focused ion beam ("FIB") performance improvements for round beams. These improvements have arisen primarily from improved electrostatic lens designs and reduced working distances, as well as from the introduction of automated variable apertures. However, at this point in time these improvements are near their fundamental limits, yet the semiconductor industry and other markets require increased milling throughput and cut quality, particularly for Fab applications.

It is becoming increasingly difficult to achieve beams with sufficient current that are small and thereby sharp enough for precision milling applications using conventional round beams. In many applications such as with slice & view applications where a "slice" is milled out of the surface of a work piece followed by an exposed cross-sectional surface being imaged, for example, by a scanning electron microscope ("SEM"), other cross-sectioning applications, and rapid transmission electron microscope ("TEM") sample preparation, besides the need for a clean, fine cut, other capabilities from the beam are required. For example, in some of these applications, significant amounts of material must be removed. Not surprisingly, it is difficult to achieve a single beam that can satisfy all of these criteria. Even if the beam is small enough to meet sharpness requirements and have adequate resolution for precise, clean cutting, excessive time is normally needed to mill away all of the material because the beam's current is usually fairly small.

Shaped beam systems have been developed that can generate geometric shapes (such as rectangles) with straight edges for making sufficiently fine edge cuts, and at the same time, their beam spot shapes are large enough for removing (or depositing) significant quantities of material. See, for example, U.S. patent application Ser. No. 09/765,806 entitled "Shaped And Low Density Focused Ion Beams" to Gerlach et al., which is hereby incorporated by reference. It teaches methods for producing a shaped (e.g., rectangular shaped) ion beam having a relatively low current density and sharp edge resolution. In addition, it teaches both the aperture imaging (projection optics) as well as the defocused emitter imaging (shadow imaging) methods for forming shaped beams. It further teaches using a straight aperture edge at or near the beam optical axis in combination with beam under-focusing to reduce chromatic and spherical aberrations across the corresponding beam edge. In addition it teaches that a chromatic limited beam with a rectangular aperture produces a beam with constant chromatic aberration across each beam edge. The strongly under-focused shaped beams as well as the projection shaped beams are particularly attractive for beam chemistry because the current density of the shaped ion beam can be made sufficiently small that the etching or deposition rate is not limited by the exhaustion of adsorbed gas molecules, and in addition, the overall beam current can be made sufficiently high to achieve satisfactory etch and deposition rates. However, such systems may not fully address the high current, high current density, and unique density shape requirements for improved milling resolution and throughput desired in many applications.

Accordingly, what is needed is a method and system for generating a shaped beam having desired current, current density, and shape characteristics for particular milling and material deposition applications.

SUMMARY OF THE INVENTION

The present invention provides improved schemes for generating shaped beam spots having a desired geometric shape using rectangular, elliptical, or semi-elliptical shaped apertures having at least one sharp edge. Depending on the particular beam spot that is desired, combinations of techniques including defocusing, aperture offsetting, stigmation adjustment, and rotation by stigmation can be used in both spherical aberration dominant and chromatic aberration dominant environments to achieve a desired-beam for a desired application. In some cases (e.g., using a semi-circular aperture), the resulting beam has a sharper edge with the same beam current than with conventional shaped beams. In other cases (e.g., with chromatic limited rectangular apertures), the same beam width but with more beam current can be attained.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which:

FIG. 1A is a block diagram of a cross-sectional milling region.

FIG. 1B is a top view of a beam spot taken along lines 1B—1B of FIG. 1A.

FIG. 2A is a ray diagram showing the effects of spherical aberration.

FIG. 2B is a graph showing spherical aberration effects on beam radius for different de-focus values.

FIGS. 7A through 10B show plot and density graphs for different simulated round focused ion beam spots.

FIGS. 11A through 17C show plot and density graphs for different simulated rectangular focused ion beam spots.

FIGS. 18A through 20C show plot and density graphs for different simulated rectangular focused ion beam spots with higher currents than those of FIGS. 11A through 17C.

FIGS. 21A through 26B show plot and density graphs for different simulated semi-circular focused ion beam spots.

FIGS. 27A and B show plot and density graphs for a round beam having the same beam current as FIGS. 21A through 26B.

FIG. 28 shows comparison beam density graphs for simulated round and elliptical shaped focused ion beam spots.

FIGS. 29A and B show beam plot and density graphs for a simulated half-semi-circle focused ion beam spot.

FIGS. 30A through 32C show plot and density graphs for different simulated rectangular focused ion beam spots modified with stigmation and under-focus.

FIGS. 33A–D show plot and density graphs for a simulated semi-circle focused ion beam spot modified with stigmation and taking spherical aberrations into account.

FIGS. 34A through 37B show plots and density graphs for different simulated rectangular focused ion beam spots dominated with spherical aberration and adjusted with stigmation and under-focus.

FIG. 38 is a table with beam spot parameters for different beam spots produced using methods of the present invention.

DETAILED DESCRIPTION OF THE PREFERRED EMBODIMENTS

Introduction

Figure 3:
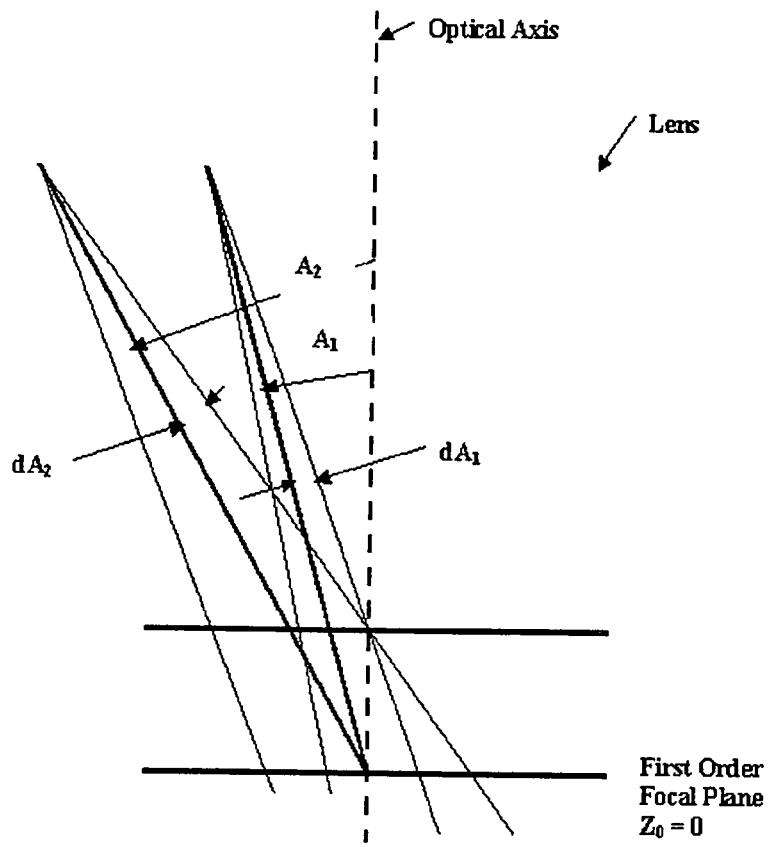
FIG. 3 is a ray diagram illustrating effects of chromatic aberration.

With reference to FIGS. 1A and 1B, microstructure milling tasks such as cross-sectional cutting for imaging and metallurgical applications require beams with at least one sharp edge for cutting away a slice that leaves a straight, "clean" cross-sectional surface. FIGS. 1A and 1B show a target sample region where such a cross-sectional slice (block or triangular in the depicted figure) is to be cut away using a rectangular shaped beam spot. FIG. 1A is a side view of the beam spot and milling region, while FIG. 1B is a top view of the beam spot taken along lines 1B—1B of FIG. 1A. These figures indicate nomenclature that are used consistently throughout this disclosure.

The depicted beam spot has a leading edge and a trailing edge. The "leading edge" refers to a straight, sharp edge of the spot that can be used to mill away sharp, vertical surface faces. Conversely, the "trailing edge," which is on the other side of the spot from the leading edge, usually can have a larger tail (i.e., greater fall-off). The beam spot also has beam width and depth dimensions. In some applications not limited by gas absorption rates, different requirements such as the need for high overall current, high and controllably tapering current density profiles, sharp edges with high current densities, and minimized depths or widths may be required. For example, as indicated in FIG. 1A, in some cross sectioning applications, the cut must be quite vertical and straight from top to near bottom. The upper corner of the cut may require a sharp corner, while the bottom corner sharpness may not be as important. In other cases, such as when making the indicated triangular cut, a beam spot with a sharp, straight leading edge and a high current density profile tapering from leading edge to trailing edge may be needed. In addition, with some cross-sectioning and slice & view tasks, the leading edge needs to have a high current density and very sharp resolution, but the spot's depth and/or width may need to be very narrow. Likewise, a sharp corner at the cross section top may require small tails along the sides or behind the trailing edge of the beam spot. Accordingly, among other things, embodiments of the present invention provide solutions for attaining different angular apertured shaped beams having at least one sharp edge, along with desirable current and current density characteristics for performing various milling tasks.

With shaped beam systems, a beam having a desired geometrically shaped spot is formed by a shaping aperture typically disposed between one or more lenses in a charged particle (e.g., FIB) column. (Note that for convenience, ion beams are generally discussed in this disclosure, but charged particle beams within the context of the present invention are not limited to ion beams. As persons of skill will recognize, they may encompass any suitable charged particle beams including but not limited to ion, electron, and other charged particle beams.) Projection systems are commonly used for creating these shaped beams. They typically involve focusing an image of the aperture onto the target surface. Normally, all ions reaching and passing through the aperture regardless of their angles allowed by a separate angle limiting aperture contribute to the focused spot.

The present invention explores and extends what hereinafter is refer to as "angular aperture shaped beams" wherein the aperture passes charged particles (e.g., ions) falling within a predefined range of incidence angles as a function of the azimuthal angle about the beam axis. The term, "shadow imaging" refers to one "angular aperture shaped beam" method described in the above-referenced patent application, where the emitter is imaged and the target surface along the beam optical axis is positioned such that the spot is considerably under- or over-focused such that aberrations are small compared to the beam size. With this approach, a beam having a predetermined shape as well as a relatively uniform beam current density is generated. If the beam optical axis is at or near a sharp, straight aperture edge in combination with sufficient under-focus, the chromatic and spherical aberrations will not pass across the corresponding beam edge and thus an especially sharp nearly straight beam edge results.

In this disclosure, the "angular aperture shaped beams" are extended to chromatic limited rectangular, elliptical and semi-elliptical beam shaping apertures, where the emitter is focused at or near the target plane. These methods achieve more beam current than a round aperture beam having the same beam width. In addition, methods to improve the beam size and shape of spherical limited, rectangular, elliptical or semi-elliptical beams using combined defocus and stigmation are described. The D-aperture (semi-circular aperture) is also extended to smaller size while still having a sharp edge. Thus, in the next sections, spherical and chromatic aberration, as pertaining to the present angular apertured approaches, are briefly discussed.

Spherical Aberration Limited Beam Shapes

As a result of spherical aberration, a defocused (under- or over-focused) charged particle source changes the shape of the charged particle beam where it intersects a target plane. The radius of spherical aberration as a function of focus, is given by the equation:

$$R_S = C_S A^3 - Z_0 A \tag{1}$$

where $C_S$ is the spherical aberration coefficient, $A$ is the beam ray angle (in radian units) with respect to the optical axis (which can be controlled with the beam shaping aperture) and $Z_0$ is the defocus distance measured from the first order focal plane, in the direction towards the lens, to the actual target plane. FIG. 2A shows ion rays in a plane through the optical axis according to Equation 1. As is well known and seen in this figure, spherical aberrations make the high angle rays fall short of the first order focal plane. Note that the spherically aberated beam envelope has a minimal diameter at a location called the Least Confusion Disk (LCD) whose radius is given by:

$$R_{LCD} = \frac{1}{4} C_S A_0^3 \quad (2)$$

with a focal distance (or defocus value):

$$Z_0 = \frac{3}{4} C_S A_0^2 \quad (3)$$

where $A_0$ is the maximum beam angle at the beam shaping aperture.

FIG. 2B also demonstrates effects of spherical aberration. Where the beam angle increases for an under-focused beam, the spherical aberrated and defocused rays first go in the negative radius directions and then into positive directions with respect to the optical axis. Under the Least Confusion Disk (LCD) condition, the maximum negative and positive excursions are equal. As shown in FIG. 2A, the Least Confusion Radius (LCR) is another spherical aberration defocus condition. The value of the beam radius at this part of the beam is:

$$R_{LCR} = 0.385 C_S A_0^3 \text{ or } \approx \frac{3}{8} C_S A_0^3 \quad (4)$$

where $$Z_0 = C_S A_0^2 \quad (5)$$

where $Z_o$ has units corresponding to those used for $C_S$.

With this focus setting, the maximum beam angle rays go in the negative R direction and then end at the beam axis. This condition can be favorably used with the semi-circular (D-shaped) aperture discussed later. Note that both the LCD and LCR focus conditions are functions of the maximum beam angle $A_0$, which can be controlled with the beam shaping aperture.

Chromatic Aberration Limited Beam Shapes

The chromatic aberration beam radius for a given ray angle is given by the equation:

$$R_C = (C_C dE/E_0 - Z_0) A \quad (6)$$

where $C_C$ is the chromatic aberration coefficient and $dE/E_0$ is the ion energy spread divided by the average ion energy. A condition similar to the spherical aberration LCR can be defined for chromatic aberration. FIG. 3 demonstrates that as the beam angle increases so does the chromatic aberration. If one under-focuses the beam (increase $Z_0$), then as the beam angle gets larger, the ray hits the target at a larger radius and therefore compensates for the chromatic beam spread. Unlike with a spherically aberrated beam, a chromatic beam spread has a normal distribution and does not have a sharp, well-defined radius as a function of beam angle. However, one can define a defocus condition that will leave little tail beyond the optical axis as follows:

$$Z_0 = C_C dE_0/E_0 \quad (7)$$

where $dE_0$ is the beam source energy spread. Under this condition, rays with energy $dE_0$ less than $E_0$ will have radii equal to zero for all ray angles, A, because then $R = A (C_C dE_0/E_0 - Z_0) = 0$. With the equation (7) condition, only 12% of the total chromatic beam tails will extend beyond the optical axis at a given beam angle, since the energy has a normal distribution.

Accordingly, by controlling defocus (Zo) and maximum allowed beam angle (Ao), one can take into account spherical and chromatic aberration to create beam spots with favorable characteristics. This is discussed in greater detail below.

FIB System

Figure 4:
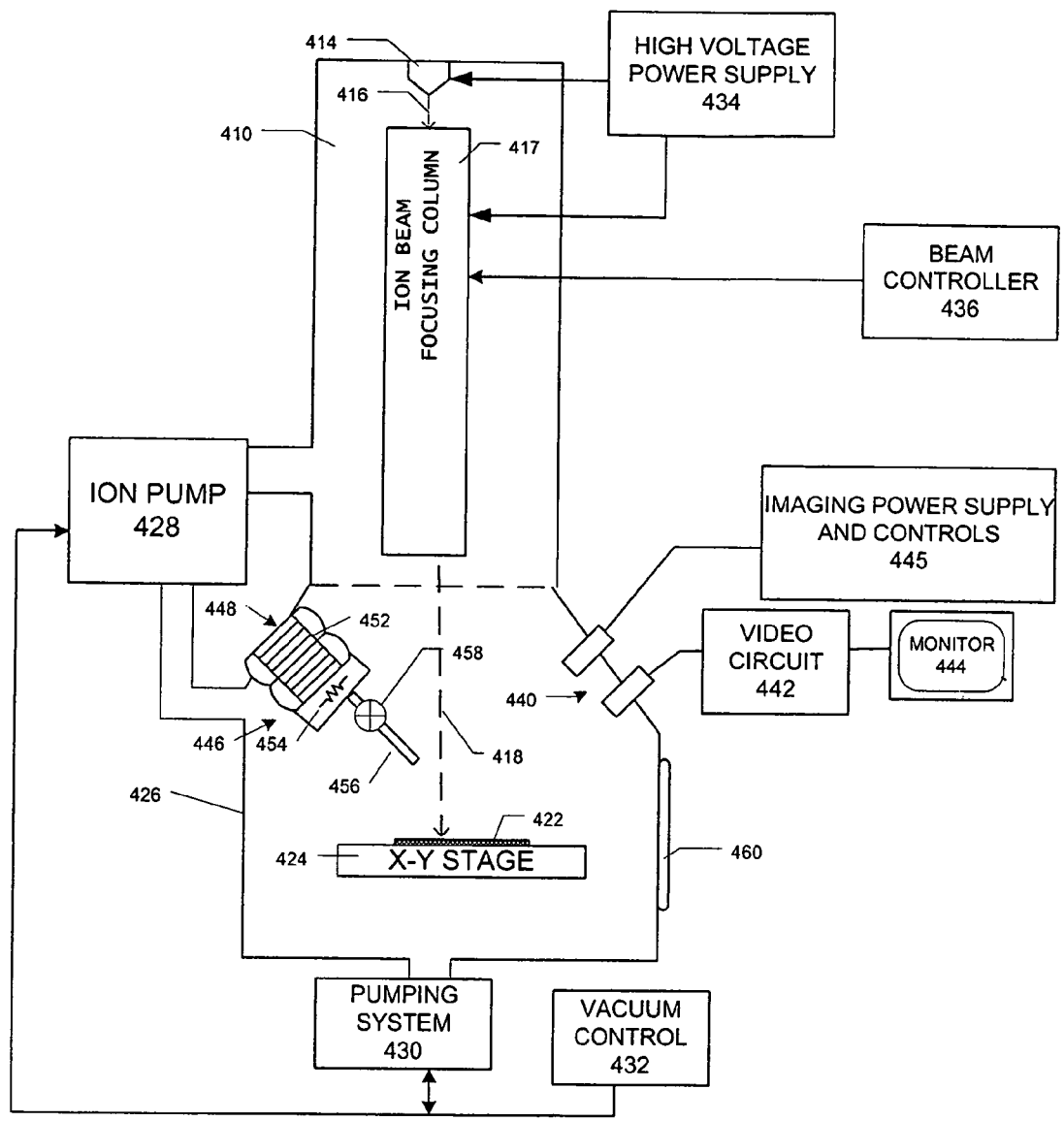
FIG. 4 is a block diagram of one embodiment of a FIB system of the present invention.

FIG. 4 schematically shows one embodiment of a shaped focused ion beam ("FIB") system suitable for use with the present invention. Note that the identified components are not required in all applications. Moreover, the depicted sizes and relative positions are not necessarily to scale or consistent with all configurations. Also, this system can be used either for a projection approach or for an angular apertured approach depending on the particular configuration of the optical components in the FIB column.

Figure 5:
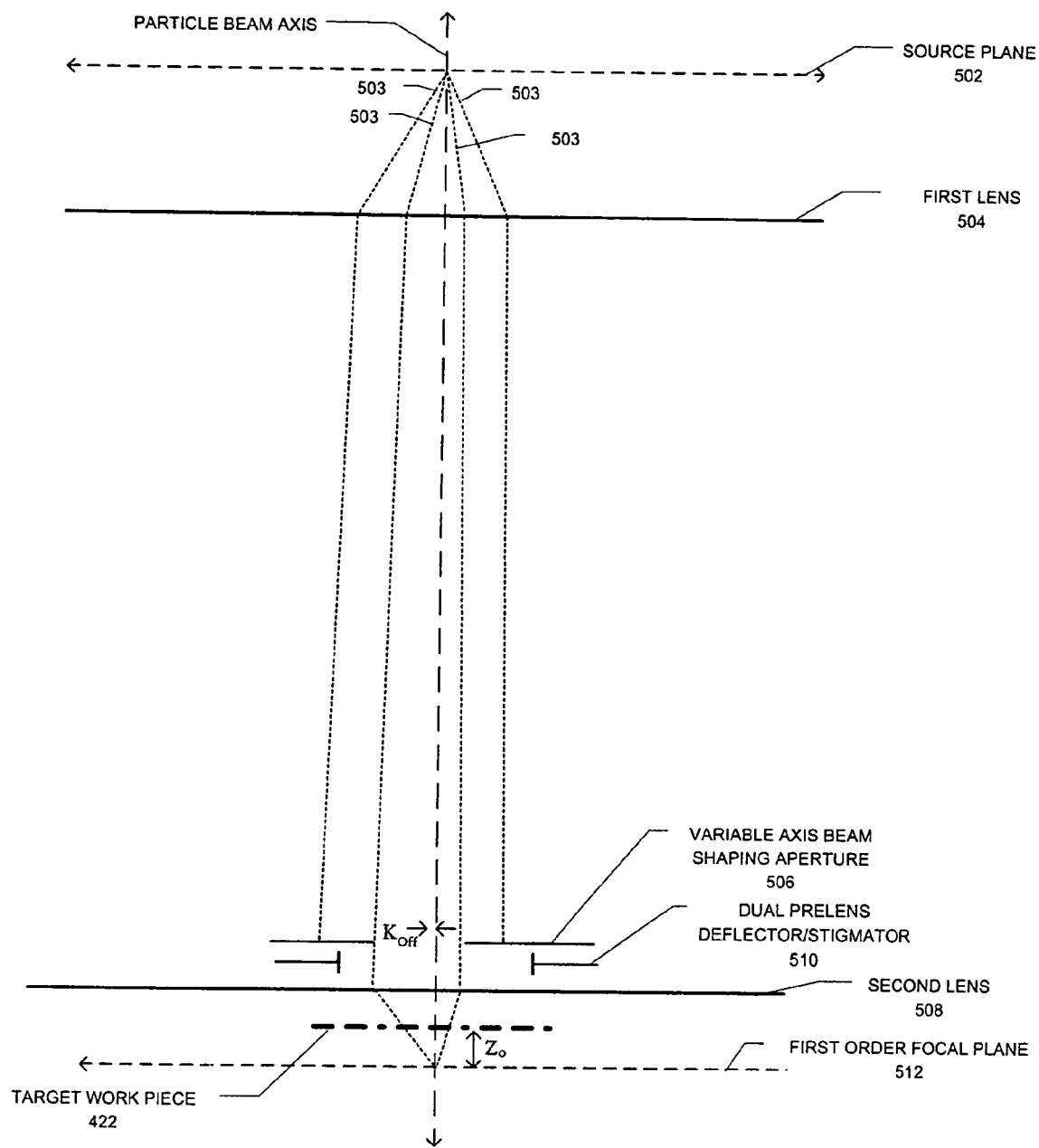
FIG. 5 is a partial block and ray diagram of an optical system for a FIB column of the system of FIG. 4.

The depicted shaped beam system includes an evacuated chamber 410 having an ion source 414, such as a liquid metal ion source of a plasma microbeam ion source, and a focusing column 417, which includes an optical system such as is shown in the block diagram of FIG. 5 for defining a desired shaped ion beam 418 and focusing it onto a target work piece 422. (It should be recognized that the term "focus" is used broadly, refers generally to the re-directioning of source ions into a beam directed to the target work piece, and covers shaped beams that are technically defocused with respect to a first-order focal plane.) Focusing column 417 uses a two-lens ion focusing structure for generating an angular apertured shaped beam. Skilled persons will understand that the lenses and other "optical" elements used with focused ion beams use electrostatic or magnetic fields to control ions in the beam, and that the optical elements are controlling a stream of ions. Also, the designs may include only one or up to several lenses. Moreover, while the principles of the angular apertured approach are discussed using this FIB system, they apply equally to other charged particle systems (such as e-beam systems) as long as suitable optical components for such other systems are used.

Unfocused ion beam 416 passes from source 414 through column 417 emitting a shaped beam 418 toward work piece 422, which is removably mounted on movable X-Y stage 424 within the lower portion of chamber 426. The work piece 422 can be any material that may be worked upon by beam 418 to achieve a desired result. It could comprise, for example, a semiconductor device, photo-lithographic mask, magnetic storage head, and the like. The particular shaped beam parameters being used will depend on the object material, as well as on the result that is desired. An ion pump 428 is employed for evacuating neck portion 410. The chamber 426 is evacuated with turbo-molecular and mechanical pumping system 430 under the control of vacuum controller 432.

High voltage power supply 434 is connected to liquid metal ion source 414, as well as to appropriate electrodes in focusing column 417 for forming an approximately 30 keV ion beam 418 and directing the same downwardly. Controller 436 is coupled to the focusing column 417 and in particular to deflector plates, a stigmator, and to a variable axis, variable shape aperture within the focusing column 417 in order to control beam 418, for example, to rotate, deform, and/or re-position it on the target work piece 422 in accordance with a desired task. (In some systems, the deflection plates, stigmator, and/or other optical devices are placed outside of the ion column after the final lens, as is well known in the art.) Through controller 436, a user can control beam 418 to be scanned in a desired manner through commands entered into a conventional user interface (not shown). Alternatively, controller 436 may access a memory storage device to upload instructions to cause the controller to control the system to scan a path, using a predefined beam shape.

The source 414 typically provides a metal ion beam of gallium from a field ion emission source (liquid metal ion source (LMIS)), although other ion sources, such as a multi-cusp or other plasma ion source, can be used. While this source is typically capable of being focused into a sub one-tenth micron wide beam at work piece 422, one advantage of the invention is that it doesn't always require such acuity. In fact, using a D-shaped aperture with large beam current, it is capable of achieving equivalent (or even better) sharpness with the beam focused down to a lesser degree (e.g., focused to 5 microns). This is because the beam spot has a sufficiently sharp edge resolute enough for performing a desired application. An electron multiplier 440 used for detecting secondary emission for imaging is connected to a power supply and controls 445 and to video circuit 442, which supplies drive for video monitor 444 for viewing work piece 422 as it is being worked upon.

A gas source 446 is located inwardly of the side of chamber 426 by translation device 448 adapted for positioning the source via support structure within bellows 452. U.S. Pat. No. 5,435,850 to Rasmussen for a "Gas Injection System" and U.S. Pat. No. 5,851,413 to Casella, et al. for "Gas Delivery Systems for Particle Beam Processing," both assigned to the assignee of the present invention, discloses apparatuses for introducing and directing gaseous vapor toward work piece 422. Gas source 446 includes a reservoir 454 with a heater, which may comprise a membrane type heating device and can be used for raising the temperature of a compound within reservoir 454 to a temperature for providing a suitable stream of molecules for beam-induced reactions as hereinafter more fully disclosed. A transfer tube or nozzle 456 comprising a capillary tube provided by a hypodermic needle extends from reservoir 454 and is connected thereto via control valve 458 adapted for releasing gaseous vapor. The nozzle is extended and translated in orthogonal directions substantially perpendicular to its axis employing translation apparatus 448, so that gaseous vapor can be aimed directly toward a region on the target surface of work piece 422.

A door 460 is opened for inserting work piece 422 on stage 424 which may be heated. The door is interlocked so that it cannot be opened if the temperature in reservoir 454 is substantially above room temperature. A gate valve is closed before door 460 can be opened to seal off the ion source and focusing column apparatus.

When reservoir 454 is raised to a desired temperature for vaporizing the compound within reservoir 454, valve 458 may be opened by withdrawing an actuator rod from outside the apparatus to open and regulate the position of valve plunger, while the nozzle 456 is directed towards the desired area of the work piece. Bellows 452 accommodate movement of the nozzle assembly and reservoir relative to the work piece without affecting the vacuum within chamber 426.

The vacuum control system along with the heater of gaseous vapor source 446 are operated to provide an appropriate vapor pressure condition for establishing a gaseous vapor flux in the chamber as directed toward substrate 422 for etching or depositing material. To establish a given gaseous flux, the reservoir is heated to a predetermined temperature.

The high voltage power supply 434 provides an appropriate acceleration voltage to electrodes in ion beam column 417 for energizing and focusing ion beam 418. When it strikes the work piece having condensed gaseous vapor adhered thereupon, the ion beam provides energy for initiating a reaction between the gaseous compound and the substrate and for either enhanced etching/milling of or material deposition upon the work piece.

As mentioned earlier, the vacuum system provides a vacuum of between approximately $1\times10^{-7}$ Torr and $5\times10^{4}$ -Torr within chamber 426. With emission of gaseous vapor, the chamber background pressure is suitably about $1\times10^{-5}$ Torr. In an exemplary embodiment, the gaseous source 446 is heated to a temperature for providing an appropriate gaseous flux via the capillary tube of the hypodermic needle, while the metal ion source and focusing column are suitably controlled for generating a corresponding appropriate ion flux. Skilled persons can readily determine appropriate pressures and gas flows for any particular application.

FIG. 5 is a hybrid block/ray diagram for one embodiment of a FIB column 417 of the present invention. It depicts a configuration for the basic optical components that affect beam spot shape and sharpness in connection with the angular aperture beam-shaping techniques discussed herein. Also shown are defined parameters that are used for the same. The column includes source plane 502, first lens 504, variable axis beam shaping aperture 506, second lens 508, stigmator/deflector assembly 510, and target work piece 522. Also shown is the first-order focal plane 512, along with beam shape parameters: $Z_o$ (distance from the first order focal plane to the target plane) and $K_{Off}$ (displacement between the beam optical axis and the beam shaping aperture axis).

The depicted focusing configuration employs an angular aperture approach. With this approach, instead of configuring the lenses 504, 508 to image the aperture to the target surface (as would be the case with a projection scheme), the source is imaged to the target surface (albeit out of focus by a set amount), and the shaping aperture 506 is formed to allow only ions having particular maximum incidence angles, at the aperture's sharp edge, pass through to the target surface. In effect, by limiting beam incidence angles at the sharp edge of the aperture and by controlling the defocus value, $Z_o$, in accordance with the above described equations relating to spherical and/or chromatic aberration, the sharp edge of the aperture is imaged to the target plane. Thus, with a shadow imaging version of the angular aperture approach, emphasis is put more on channeling the rays within desired angular parameters through the beam angle limiting aperture 506 along the optical beam axis and onto the target work piece 422 in addition to converging the rays at a single point a desired distance away from the second lens 508.

The target work piece 422 is placed a defocus distance, $Z_o$, away from the first order focal plane. $Z_o$ may be positive, negative or 0. As used herein, if positive, it is move away from the focal plane toward the second lens and is said to be "under-focused." Conversely, if negative and thereby placed off of the focal plane away from the second lens, it is "over-focused." The values of $Z_o$, $K_{off}$, and other parameters can be manipulated, as will be discussed further below, to generate various sharp-edged shaped beams having different currents and current density profiles. In the sections below, different approaches and considerations for generating desired beam spots are discussed.

The deflector/stigmator assembly 510, for simplicity, is lumped together in this drawing, but persons of skill will recognize that this assembly encompasses two separate functions and could certainly be implemented with two separate devices. A conventional electrostatic dual octupole may be used for making stigmation adjustments and to deflect the shaped beams as taught herein. Furthermore, while the dual octupole is shown disposed above the second lens 508, other stigmation and scan designs may be employed, such as a single octupole between the second lens and the target.

Sharp Edged Shaped Beams

Figure 6A:
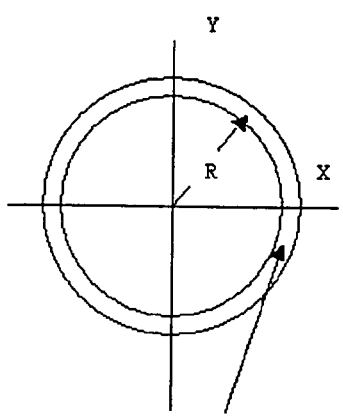
FIGS. 6A–6C are graphs showing beam density determination regions for beam characteristic simulations used in the present invention.
Figure 6B:
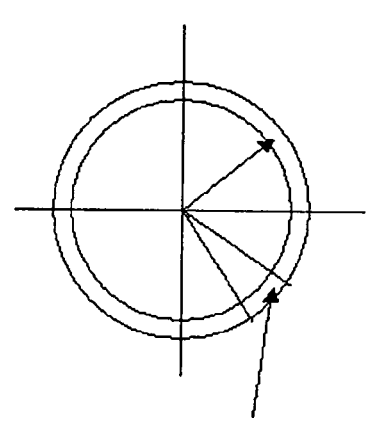
Figure 6C:
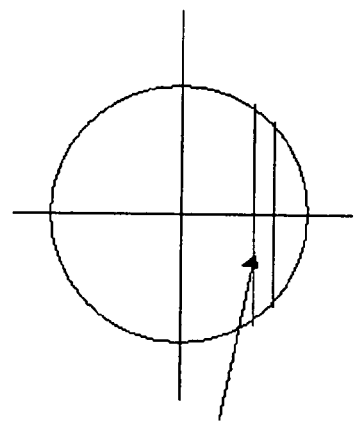

In the following sections, different angular aperture shaped beam cases are examined and described using a simulation program known as "Monte Carlo FIB Beam Simulator," which provides beam shape and density data. The simulations take into account optical parameters including spherical aberration, chromatic aberration, de-magnified source size, off-axis aperture displacement, maximum allowed beam incidence angle, and stigmation. With reference to FIGS. 6A–6C, the simulated beam densities use the X (or Y) density, dN(X)/dX, as opposed to the commonly used radial density. This is a better model for most sharp edge milling applications. However, the use of radial density (dN(R,T)/R dR dT) simulations may be better for imaging in some cases. Also, before discussing the different examined angular aperture shaped beam cases, it is helpful to distinguish between high and low current beams because they can behave differently for different beam shapes generated using different parameters. For purposes of this disclosure, a "low current" beam is generally defined as a beam that is mostly chromatic aberration limited, or around or smaller than 100 pA. Conversely, a "high current" beam is a beam that is mostly spherical aberration limited, or with current that is close to or greater than 10 nA. Depending on the particular optical parameters and milling application, beams having currents falling between these values may be deemed as low or high current beams.

Low Current Round Beam Case

FIGS. 7A and 7B show beam simulation plots for a round aperture beam with the aperture centered on the optical axis ($K_{Off}=0$) and the focus set to the first order focal condition defined by $Z_0=0$ mm. Also, with this case, $C_S=1000$ mm, $C_C=100$ mm, and there is no stigmation. For the small beam current round and rectangular beams addressed herein, a de-magnified source diameter ($D_G=0.01$ μm) is employed. The aperture generates a 1.0 mr maximum half-angle for the beam leaving the final lens, which produces a 7.6 pA beam current assuming a source brightness of $3.1\times10^6$ A/(cm$^2$·sr). This 1 mr half-angle also generates spherical and chromatic radii of 0.001 μm and 0.027 μm, respectively, at the first order focal plane. Thus the beams are significantly chromatic aberration limited. The scatter plot of FIG. 7A represents the beam shape, which is round, and the X- and Y-beam densities are shown in FIG. 7B. Unfortunately, as seen in FIG. 7B, this first order-focused ($Z_o=0$) beam has substantial tails, which are typically detrimental in milling.

FIGS. 8A and 8B represent the round beam with a small amount of under-focus, $Z_0=0.01$ mm, which results in the beam broadening a little. FIGS. 9A and 9B demonstrate the beam with further under-focusing ($Z_0=0.03$ mm), which even further broadens the beam. However, in both of these cases, as shown in FIGS. 8B and 9B, the tails are still present.

With reference to FIGS. 10A and 10B, the round aperture can be moved off-center to generate more beam density on one beam side for milling an edge. This is simulated for the aperture placed off-axis a distance equal to the aperture radius in the Y-direction ($K_{Off}=1.0$) and the beam being under-focused 0.03 mm. Clearly the left sided Y-edge beam density is sharper and has less tail, while the right side Y-edge is less sharp and has a longer tail. Comparing FIGS. 7A to 9B with FIGS. 10A and 10B demonstrates a significant improvement in the Y-axis beam density onset for milling sharp edges obtained by offsetting and under-focusing the beam. Note that the under-focus value agrees with the estimated value from Equation 2.5, $Z_0=C_C dE_0/E_0=100$ mm×0.00027=0.027 mm, which is a confirmation of the value of this equation.

Small Current Rectangular Beams

FIGS. 11A to 17C show rectangular aperture beams with the shaping aperture that produces a 4.0 mr maximum half-angle ($A_{0X}=4$ mr) along the major rectangular axis (X axis in the figure) and a 0.8 mr maximum half-angle ($A_{0Y}=0.8$ mr) along the rectangular minor axis (Y axis in the figure) with the same spherical and chromatic aberration coefficients as for the previously discussed round aperture beam case. This yields a beam with 31.2 pA of current, which is 4.1 times as much current as the round aperture case.

FIGS. 11A–C are for the first order focus, $Z_0=0$ condition. Alternatively, with the beams of FIGS. 12A–C and 13A–C, an under focus of $Z_0=0.03$ mm, and an aperture offset of $K_{Off}=0.6$ and 1.0, respectively, are used. As can be seen, the beam Y-edge sharpness increases with aperture offset.

FIGS. 14A–C demonstrate the rectangular aperture beam with over-focus and offset ($K_{Off}=-0.03$ mm), which reverses the Y-axis sharp edge position. This beam is broader and has a little less of a sharp edge than with the under-focus condition. (Note that if there was no spherical aberration, the under- and over-focus conditions would produce the same but reversed beam shapes.)

FIGS. 15A to 17C demonstrate the rectangular beam with $K_{Off}=1$ and increasing under-focus. The beam becomes broader and the current density more uniform, which can be utilized for a low beam density gas chemistry application, for example. A disadvantage to the under-focused, aperture offset rectangular aperture beam in FIGS. 13A–C in some applications, however, is that it has a larger full width than the first order focused, centered aperture round beam in FIGS. 11A–C. This can be a disadvantage regarding slice-and-view milling applications.

FIGS. 18A to 20C show a rectangular aperture beam with smaller beam angle in the minor direction (Y-direction, $A_{0Y}=0.4$ mr). The first order focused, non-aperture offset beam shown in FIG. 18A–C has less width in the Y direction than the round aperture low-current beam, and it has twice the beam current. With under-focus and aperture offset (FIGS. 19A–C and 20A–C), the Y-edge sharpness of this rectangular beam is better than the offset, under-focused round aperture beam in FIGS. 10A and B, and its beam width is less than half. In fact, the beam width is now down to about the width of the first order focused, non-aperture offset round beam in FIGS. 7A and B. In other words, this rectangular beam has twice the beam current as the round beam plus it has a sharper edge (which for the round beam requires under-focused, aperture-offset conditions) and at the same time has a small beam width (which for the round beam requires first order focus and non aperture offset conditions). With its sharp edge, high current, and small Y axis width, such a rectangular aperture beam is ideally suited for many slice and view applications. Note that one could increase the current even more by employing a line source in a microbeam plasma source in conjunction with these rectangular aperture cases.

High Current D-Aperture Beam Case

FIGS. 21A and B to 26A and B show plots for different high current, D-shaped beam spots. (The term "D-shaped" refers to any bisected or semi elliptical shape. It includes any substantially elliptical shape bisected along either its minor or major axis. In either case, it is left with a straight edge portion that may be a small or larger part of the ellipse's overall circumference.) In FIGS. 21A to 26B, the elliptical aperture shape is round, with $A_{0X}=A_{0Y}=16.3$ mr.

FIGS. 21A and B demonstrates the beam under the first order focus condition. This beam has a sharp edge at Y=0, but it is very sharply peaked in both the X- and Y-directions with large tails, which is not so suitable for milling applications. In addition the beam is quite broad. As the under-focus is increased, the beam moves from the +Y to the −Y side of the Y-axis. When the under-focus is set to a value $Z_0=0.27$ mm (FIGS. 23A and B) according to the sum of Equations 5 and 7, the beam has a very sharp Y-edge, D-shape and roughly minimum size. Under this condition the large angle rays move away from the beam axis and then decrease back towards the optical axis at the target plane in the LCR condition. The Y-edge sharpness is limited only by the de-magnified source size, small chromatic aberration contributions, and beam interaction effects, which are not included in the present beam simulation. The Y-beam density falls weakly with −Y and the X-beam density is somewhat flat. This beam can be quite useful for high current milling with a sharp edge, such as for initial material removal for integrated circuit cross sections.

Note that this under-focused beam is relatively large and has a lower current density, but none-the-less has this sharp, straight edge. In addition the beam density in the Y-direction is somewhat tapered away from the sharp edge, and the X-density distribution is somewhat uniformly distributed. This beam having large beam current and a sharp edge could be useful for hogging out cross sections, where it can be scanned in X- and Y-directions in a pattern towards the desired target interface. The sloped density distribution in the Y-direction can be beneficial to generate a sloping hole towards the cross section target. Beam chemistry can perhaps be employed since the beam has relatively low density with its large area. An LMIS FIB column lends itself well to high current, D-aperture optics, because the two-lens magnification saturates at about 1.4, since high magnification makes the first lens spherical aberration contribution very large. One can then increase beam current using larger D-apertures and still obtain this sharp milling beam edge.

FIGS. 24A to 26B demonstrate further increases in the under-focus condition. The beam still has a sharp Y-edge but increases in radius. Furthermore, the beam density becomes more uniform in both X- and Y-directions with increasing under-focus, which can be useful for gas chemistry. The scatter plots show greater beam density $d^2N/dXdY$ near the edges, but if the beam is scanned in the X direction, its Y-beam density $dN/dY$ is relatively uniform in the Y-direction over the beam width.

With reference to FIGS. 27A and B, a 50 nA round aperture beam is shown for comparison to the D-aperture beam, where a moderate under-focus is employed to reduce the round aperture beam tails. Both the D- and round-aperture Y-beam densities are shown in FIG. 28 for comparison. The round beam has a 15–85% rise of about 0.24 um, which is about 3.4 times the D-aperture edge of about 0.07 $\mu$m. In actual milling performance, the round beam edge will be even larger, because the single sided 15–85% rise underestimates the milled edge when a gaussian-like peak is employed versus an edge, which does not fall so rapidly on the opposite side. The D-aperture beam full width is about 2 times larger, but for cross sectioning and other applications, where the beam is scanning to generate a relatively large hole, this is not a disadvantage.

FIGS. 29A and B demonstrate a large current, half-elliptical aperture, which is cut along the X-axis at Y=0, where the optical axis is at X=Y=0. This beam has been under-focused to the same condition as the corresponding rectangular aperture beam, and has great similarity to the rectangular aperture beam. Note that the beam density in the Y-direction falls more rapidly than the rectangular aperture case. This shows that tuning the aperture shape can modify the beam density shape in Y. Other aperture shapes (such as a truncated triangle) can generate other results.

Beam Alignment

In this section, the use of a stigmator for aligning a beam's sharp edge with a target work piece axis (e.g., wafer device axis, stage axis) is examined. A chromatic aberrated (with little or no spherical aberration) rectangular aperture beam is used in confirming that one can rotate it with a stigmator and still preserve its sharp edge.

FIGS. 30A–C demonstrate such a rectangular aperture beam using a 45 degree stigmator setting to stretch and shrink the beam angles in perpendicular, +45 degree and −45 degree directions with reference to the X-axis. Clearly, the chromatic limited beam having aperture offset and under-focus can be rotated small amounts without destroying the sharp edge. FIGS. 31A–C show similar simulations and results with a de-magnified source added to the beam. As seen in FIGS. 32A and C when spherical aberration is added to the chromatic and source contributions, the beam becomes more fuzzy, but the rotation still produces a reasonably sharp edge when the spherical contribution is moderate.

Rotated Spherically Aberrated D-Aperture Beams

With reference to FIGS. 33A–D, the behavior is different when spherical aberration is dominant and the under-focus is large. Here, the 45 degree stigmation tears the beam near the optical axis position. This can be explained by the spherical rays being bent back towards the optical axis by the D-aperture, LCR under-focus condition. Hence when the stigmator is applied the rays going in −X go upward, and then when bent back towards the origin end up +Y. Similarly, the +X rays end up near the origin in the −Y direction.

Thus it is more difficult to rotate the D-aperture, spherical dominated beam sharp edge using the stigmator. FIG. 33D shows stigmation with greater under-focus, which doesn't significantly improve it, but slight aperture Y-offset helps slightly.

Spherical Aberrated Rectangular Beam Case with De-focus and Stigmation

With reference to FIGS. 34A to 37B, spherical aberrated, rectangular aperture beams can be improved with defocus and stigmation. FIGS. 34A and B show a spherical limited rectangular beam with first order focus, while FIGS. 35A and B show the beam under X-axis, LCD under-focus conditions. In these simulations no chromatic aberration or de-magnified source contributions were included so that the spherical aberration behavior would be more isolated and thus better understood. The X- and Y-beam sizes (note the different X-Y scales) are reduced with the spherical rays folded back over the origin, but the Y-axis rays are now too under-focused resulting in a beam that is broader than it needs to be.

FIGS. 36A and B show the case with both under-focus and stigmation, where the under-focus is set to ½ the LCD under-focus value, and the stigmator amplitude is set to ¼ the LCD under-focus value. Increasing the under-focus yields the beam of FIGS. 37A and B. which is a nice narrow beam in both directions and could be useful for TEM sample biopsy and other milling, including using a FIB or plasma ion beam column. It can be seen that the beam in FIGS. 36A and B is narrower in the Y-direction than the beam of FIGS. 37A and B, but its X-axis tails are more extensive.

Observations

FIG. 38 is a table summarizing the above simulations. It demonstrates that the 0.031 nA centered rectangular aperture beam at the first order focus plane has about the same edge resolution as the corresponding centered round aperture beam, and the former has 4.1 times more beam current. The beam edge resolution using the under-focused and offset rectangular aperture beam has about twice the edge resolution as the under-focused and offset round aperture beam. This rectangular aperture beam also has about the same or smaller Y-full width as the corresponding round beam, but it has about a 3.3 times larger X-full width. This large X-width makes little difference for scan milling sharp edges. The rectangular aperture with first order focus as well as the rectangular aperture with under (or over) focused and aperture offset are valuable for cross section cleanup, slice-and-view and other applications.

In the large current, spherical aberration case, the D-shaped aperture generates a D-shaped beam with a sharp, straight edge when properly under-focused. This D-aperture, 50 nA beam has a 3.5× sharper Y-edge than the centered round aperture beam with the same beam current. In addition, the D-aperture produces an initial Y-tail (towards the aperture flat Y-edge) that is smaller than the round aperture beam tail. D-aperture beams can be useful for hogging cross sections, and can be particularly advantageous if gas chemistry is employed.

The chromatic limited rectangular aperture beam can be rotated using the stigmator to align the sharp edge to a tool or sample axis. This will also work for other aperture shapes having a sharp edge. As more spherical aberration is added, this stigmator adjustment works less well, as the beam may tear or become distorted. However, if desired, the D-aperture could be mechanically rotated about the optical axis to align it to the target, or the target can be rotated. Likewise, a spherical aberration limited rectangular aperture beam can be reduced in size by introducing combined under-focus and stigmation. This process can also be applied to other aperture shapes, such as the ellipse or half-ellipse. Moreover, a spherical limited beam employed with a rectangular or elliptical aperture can be reduced in size by tuning the focus and stigmation such that the stigmation is accentuated in the long aperture (X-) direction and subdued in the Y-direction. 'For example, this can be accomplished by tuning the focus and stigmation approximately to $Z_0 \geq \frac{3}{8} C_S A_{OX}^2$ and $K_{ST} \cong \frac{3}{16} A_{OX}^2$, where X corresponds to the rectangular aperture long direction and $K_{ST}$ is the stigmation amplitude.

When using a Ga FIB column, one should be aware of problems that may arise such as stochastic beam blur, especially at medium beam currents, as well as space charge beam blur plus extraneous geometric aberrations at large beam currents. These extraneous geometric aberrations can arise from the beam axis defined by the source and aperture not corresponding to the two lens axes. However, proper column alignment using beam steering can limit these problems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification.

For example, persons of skill will appreciate that these same angular apertured, shaped beam concepts can be applied to a microbeam column. This column has a larger source, so that the de-magnified source contribution can be more properly balanced with the spherical aberration. Particularly attractive are rectangular beams for FIB integrated circuit cross section cleanup and slice-and-view.

Accordingly, the appended claims are intended to include within their scope such processes, machines, manufacture, compositions of matter, means, methods, or steps.

What is claimed is:

1. A FIB system, comprising:
   a vacuum system;
   a charged particle beam column positioned in the vacuum system for creating a charged particle beam for impinging upon a target, the charged particle beam column including one or more lenses and an aperture having at least one straight edge and being disposed within the column and dimensioned to produce a shaped charged particle beam at the target, said shaped beam having at least one sharp edge corresponding to the at least one aperture straight edge;
   a secondary electron or charged particle detection and imaging system; and
   a controller for controlling the shaped charged particle beam to irradiate an area on the target to mill material away from or add material to the target.

2. The system of claim 1 in which the aperture is aligned with the one or more lenses to under or over focus the charged particle beam source with respect to a target plane.

3. The system of claim 2, in which the aperture is rectangular shaped and comprises a major side corresponding to the at least one straight edge disposed near the center of the beam.

4. The system of claim 3 in which the rectangular aperture has a minor side dimension that is sufficiently small to produce a beam image at the target with a suitably small tail for a slice and view milling application.

5. The system of claim 1, wherein the charged particle column comprises a line source in a microbeam plasma source for increasing beam current.

6. The method of claim 1, in which the aperture is positioned and dimensioned in the charged particle beam column to have a maximum beam current density at the at least one sharp edge with said current density rolling off toward an opposite side of the aperture away from the sharp edge in accordance with a particular milling application.

7. The system of claim 6, wherein the beam is chromatic limited and wherein the target is defocused relative to a first order focal plane in accordance with: $|Z_0| \geq C_C dE_0/E_0$ where $C_C$ is the chromatic aberration coefficient and $dE/E_0$ is the charged particle energy spread divided by the average charged particle energy.

8. The system of claim 1, wherein the charged particle column further comprises a stigmator to adjust the beam shape in order to rotate the at least one sharp edge in alignment with an axis on the target.

9. The system of claim 1, wherein said aperture is D-shaped, and the target is de-focused away from a first order focal plane a distance $Z_0 \geq C_S A_0^2$ where $C_S$ is the spherical aberration coefficient and $A_0$ is the maximum beam angle with respect to the optical axis for beams passing through the aperture.

* * * * *